United States Patent
Zheng et al.

(10) Patent No.: US 7,433,247 B2
(45) Date of Patent: Oct. 7, 2008

(54) METHOD AND CIRCUIT FOR READING FUSE CELLS IN A NONVOLATILE MEMORY DURING POWER-UP

(75) Inventors: Jianbin Zheng, Kiang-Xu (CN); Jing Wang, Kiang-Xu (CN); Nien Chao Yang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/235,826

(22) Filed: Sep. 26, 2005

(65) Prior Publication Data
US 2007/0081377 A1    Apr. 12, 2007

(51) Int. Cl.
G11C 7/06    (2006.01)
(52) U.S. Cl. ............................. 365/189.07; 365/185.22
(58) Field of Classification Search ............ 365/189.07, 365/185.22
See application file for complete search history.

(56) References Cited

U.S. PATENT DOCUMENTS

| 6,211,710 B1 | 4/2001 | Madhu et al. | |
| 6,567,302 B2 * | 5/2003 | Lakhani | 365/185.03 |
| 7,050,343 B2 * | 5/2006 | Kumar et al. | 365/201 |
| 2003/0117847 A1 * | 6/2003 | Makuta et al. | 365/185.09 |
| 2003/0147287 A1 | 8/2003 | Lee | |
| 2004/0136248 A1 * | 7/2004 | Kozuka | 365/201 |

OTHER PUBLICATIONS

Macronix International Co., Ltd., MXIC MX29LV169T/B & MX29LV160AT/AB, 16M-Bit [2M×8/1M×16] CMOS Single Voltage 3V Only Flash Memory, Rev. 3.7, Apr. 23, 2003, 66 pages.

* cited by examiner

*Primary Examiner*—Huan Hoang
*Assistant Examiner*—Jason Lappas
(74) *Attorney, Agent, or Firm*—Haynes Beffel & Wolfeld LLP

(57) ABSTRACT

A method and circuit are described for ensuring a properly operational power-up read of fuse cells in a nonvolatile memory by selecting predefined data for loading in a portion of a fuse memory and matching the reading of the predefined data during power-up with the predefined data, thereby indicating a proper power-up read of fuse cells. The fuse memory is partitioned into a first section of fuse cells for conducting a pre-check procedure to match a first predefined data being read against the first predefined data, a second section for reading main fuse cells to match with a second predefined data being read against the second predefined data, and a third section of fuse cells for conducting a post-check procedure to match a third predefined data being read against the third predefined data.

15 Claims, 8 Drawing Sheets

METHOD AND CIRCUIT FOR READING FUSE CELLS IN A NONVOLATILE MEMORY DURING POWER-UP

BACKGROUND OF THE INVENTION

1. Field of the Invention

The present invention relates generally to nonvolatile memory integrated circuits, and more particularly, to proper loading of data during power-up.

2. Description of Related Art

Electrically programmable and erasable nonvolatile memory technologies based on charge storage structures known as Electrically Erasable Programmable Read-Only Memory (EEPROM) and flash memory are used in a variety of modern applications. A flash memory is designed with an array of memory cells that can be independently programmed and read. Sense amplifiers in a flash memory are used to determine the data value or values stored in a nonvolatile memory. In a typical sensing scheme, an electrical current through the memory cell being sensed is compared to a reference current by a current sense amplifier.

A flash memory is a type of electronic memory media in which the memory cells can be rewritten and the contents in the memory cells are kept stored without power. A typical flash memory has a life span of about 100 k to 300 k write cycles. In a dynamic random access memory or a static random access memory, a single byte is erased as opposed to a flash memory where one or more multi-bit blocks are erased and written. A flash memory combines the features of EPROM density with the electrical erase ability in an EEPROM.

Conventional flash memory cells are designed with flashing-gate transistors where each floating-gate transistor has a source region, a drain region, a floating-gate layer and a control-gate layer. An access operation is carried out by applying a bias signal to each of the regions in the flash-gate transistor. A write operation is generally carried out by a channel hot-carrier injection such that there is a flow of electrons between the source region and the drain region that are accelerated toward a floating gate in response to a positive bias applied to a control gate. A common type of erase operation uses Fowler-Nordheim tunneling, which electrically floats the drain region while applying a high negative voltage. A read operation generally includes the step of sensing a current between the source region and the drain region, i.e., the MOSFET current in response to a bias being applied to the control gate. If a memory cell has been programmed, the threshold voltage will be near or above the control gate bias in which the resulting current is low to non-existent. If the memory cell is erased, the threshold voltage is kept well below the control gate bias so that the current is substantially higher.

An electrical voltage generated from a power supply during power-up can fluctuate in which the voltage may be unstable. Configuration information of a system is typically loaded into registers during power-up for setting the configuration of the system. However, with the voltage fluctuating during power-up, it potentially could cause an error in reading on whether the configuration information has been properly loaded into the registers.

One conventional solution for verifying that the configurable information has been properly read from the nonvolatile memory is to supply the memory cells with a high voltage. The high voltage is a value that is greater than a supply voltage, particularly for a lower-power device in the 1.65 volts range. A circuit that generates a voltage greater than a supply voltage like a charge pump is likely to cause a large and unstable power variation during power-up.

Another conventional solution uses a 3 volts device to establish a bandgap reference for detecting whether a read voltage is ready. A precondition requires that the bandgap reference is established during a power-on reset. However, the configuration information could be loaded incorrectly when there are interferences to the voltage during power-up. There is also the difficulty to apply this solution to a low voltage product. For example, in a 1.8 volts product, a low bound of the power-on reset may be set to 1 volt, which presents the difficulty to design a bandgap reference at this voltage level.

Accordingly, there is a need to provide a circuit and method for an accurate read of configurable information during power-up for nonvolatile memories including low voltage flash memories.

SUMMARY OF THE INVENTION

The present invention provides a method and circuit for ensuring a properly operational power-up read of fuse cells in a nonvolatile memory by selecting predefined data for loading in a portion of a fuse memory and matching the reading of the predefined data during power-up with the predefined data, thereby indicating a proper power-up read of fuse cells. The fuse memory, which can be designed as part of a memory array for sharing a read circuit and a write circuit, or located away from the memory array with its own read circuit and write circuit, is partitioned into a first section of fuse cells for conducting a pre-check procedure to match a first predefined data being read against the first predefined data, a second section for reading main fuse cells to match with a second predefined data being read against the second predefined data, and a third section of fuse cells for conducting a post-check procedure to match a third predefined data being read against the third predefined data. The first section of the fuse cells in the fuse memory is written with the first set of predefined data for the pre-check procedure. The second section of the fuse cells in the fuse memory is written with the second set of predefined data that includes the configurable information. The third section of the fuse cells in the fuse memory is written with the third set of predefined data for the post-check procedure.

Broadly stated, a method ensuring a proper voltage applied to fuse cells in a fuse memory during a power-up read, the fuse memory having a pre-check fuse cells memory section, a main fuse cells memory section, and a post-check fuse cells memory section, comprises performing a pre-check by reading data from a first fuse cells memory section to determine if the read data from the first fuse cells memory section matches with a first predefined data; reading data from the main fuse cells memory section to determine if the read data from the main fuse cells memory section matches with a second predefined data; and performing a post-check by reading data from a third fuse cells memory section to determine if the read data from the third fuse cells memory section matches with a third predefined data.

Advantageously, the present invention can be implemented using an existing design by allocating a portion of fuse cells and registers for performing a power-up read. In addition, the present invention advantageously provides a power-up read of fuse cells in a nonvolatile memory for low voltage applications. Moreover, the present invention reduces the dimension on an integrated circuit memory that is typically required to design a testing circuit to ensure that a power-up read of fuse cells have been performed correctly. Furthermore, the present invention can be implemented without altering manufacturing process.

The structures and methods regarding to the present invention are disclosed in the detailed description below. This summary does not purport to define the invention. The inven-

DETAILED DESCRIPTION OF EMBODIMENTS OF THE INVENTION

Figure 1:
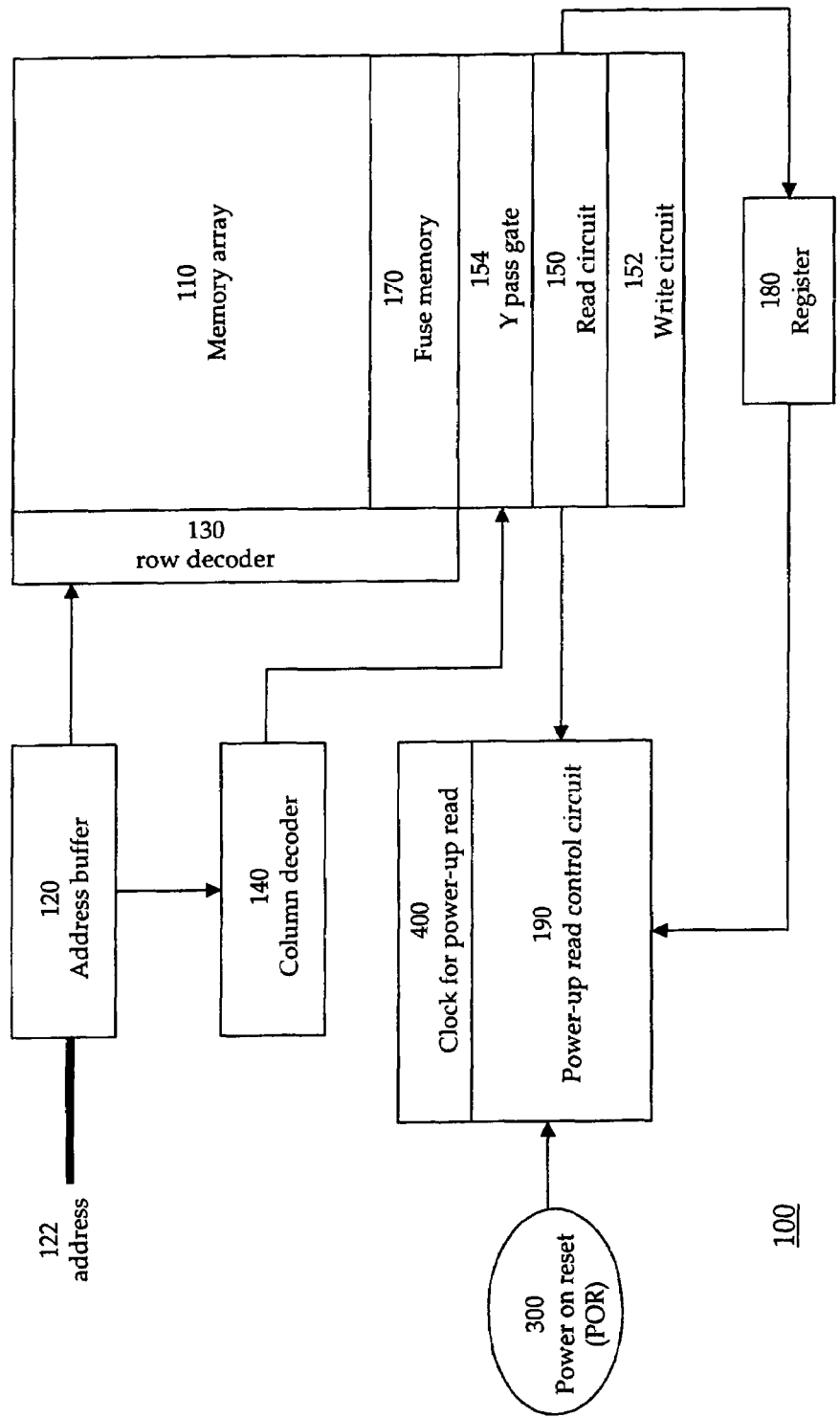
FIG. 1 is a simplified architectural diagram illustrating a first embodiment of a nonvolatile memory for reading fuse cells during power-up in accordance with the present invention.

Referring now to FIG. 1, there is shown a simplified architectural diagram illustrating a first embodiment of a nonvolatile memory 100 for reading fuse cells during power-up. A memory array 110 comprises a matrix of a plurality of memory cells arranged in the horizontal direction with rows and wordlines and in the vertical direction with columns and bitlines. When executing a read operation, an address buffer 120 receives an input address 122, and sends a row address to a row decoder 130 and sends a column address to a column decoder 140. A read circuit 150 therefore is able to read out data from a given address through the row decoder 130 and the column decoder 140. The read circuit is coupled between a write circuit 152 and a Y pass gate 154. Some suitable implementations of the memory cells in the memory array 110 include an electrically erasable and programmable NOR flash memory cells, masked ROM cells, or ferroelectric memory cells that are electrically programmable.

Fuse cells have been adopted for use in a flash memory to store configurable information, such as circuit trimming parameters. A typical use of the configurable information in fuse cells is to boot-up a memory system. One advantage of using fuse cells for memory configuration is that there is no additional cost incurred. Another use of fuse cells is for device redundancy, which fabricates redundant elements like a row of memory cells or a column of memory cells that can be used for replacing a defective memory row or column in a the memory array 110. If a defective memory row or a defective memory column is detected during test, the address location of the defective memory row or the defective memory column is stored in fuse cells. Other applications in the use of fuse cells include the storage of enable bits for a specific test configuration and a different specification in another product.

During power-up, configuration information is typically loaded to a dynamic random access memory or a static random access memory from fuse cells. The static or dynamic random access memory can be read at a faster speed while requiring a lower operating power. A volatile memory such as the static random access memory or the dynamic random access memory is also referred to in the specification as registers. Configuration information is assessable immediately after power-up, and the configurable information is loaded to registers during power-up soon thereafter.

Configuration information is written into fuse cells in a fuse memory 170 during the testing of the nonvolatile memory 100. Some examples of configuration information include the trimming information for a circuit, optional information for a different specification, redundant information and other specific parameters for the test. During power-up, the data in the fuse memory 170 will be read out and written into a set of registers or latches 180. Power-up read control circuit 190 operates based on the read data provided from the fuse memory.

Figure 2:
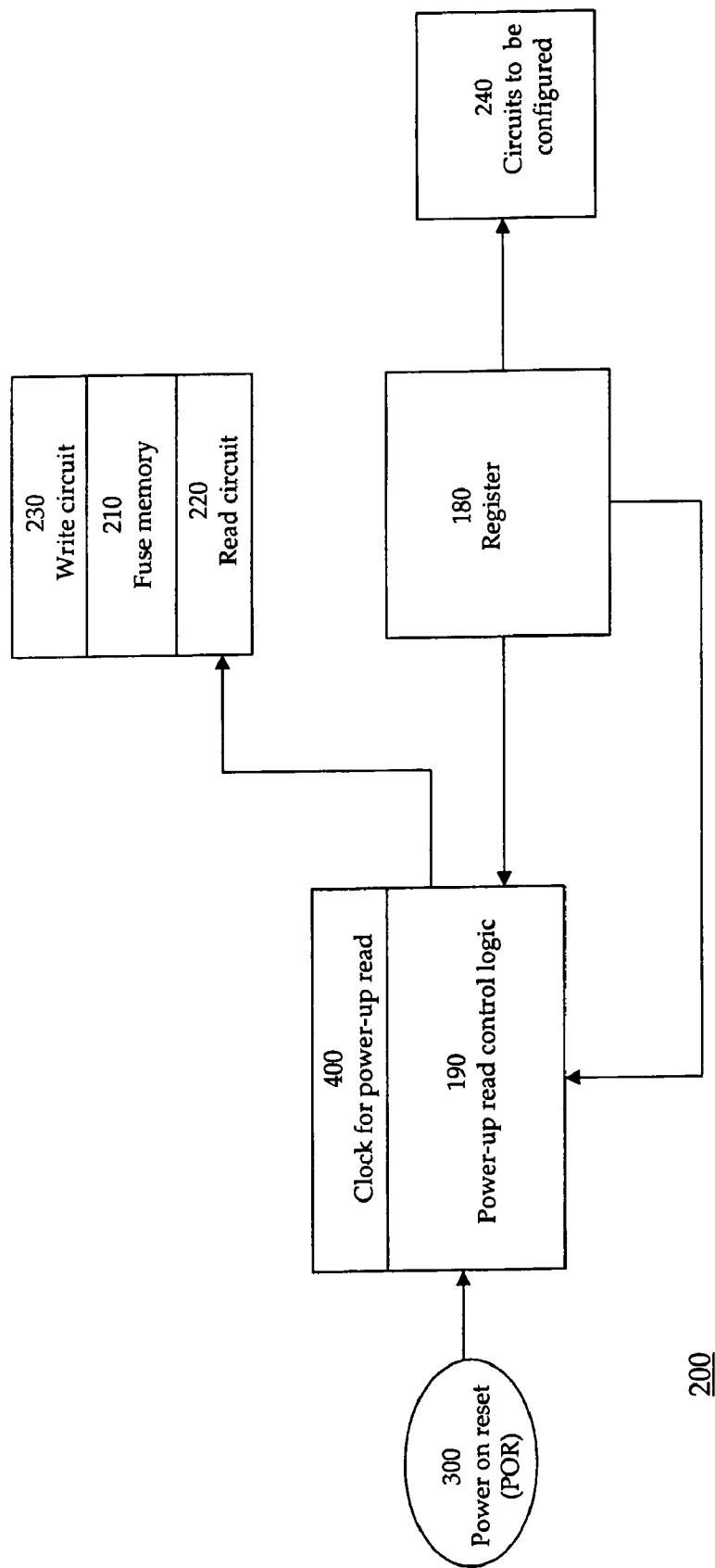
FIG. 2 is a simplified architectural diagram illustrating a second embodiment of a nonvolatile memory for reading fuse cells during power-up in accordance with the present invention.

In FIG. 2, there is shown a simplified architectural diagram illustrating a second embodiment of a nonvolatile memory 200 for reading fuse cells during power-up. In this embodiment, a fuse memory 210 is not part of a memory array and placed in a location separated from a memory array. Rather than sharing the read circuit 150 and the write circuit 152 by the fuse memory 170 in FIG. 1, the fuse memory 210 has its own set of read and write circuits where the fuse memory 210 is coupled to a read circuit 220 and a write circuit 230. The nonvolatile memory 200 provides a flexible setting of parameters in fuse cells in the fuse memory 210. The nonvolatile memory 200, compared to the first embodiment of the nonvolatile memory 100, does not require a large load for the memory array and the read operation of fuse cells in the fuse memory 210. The register 180 is further connected to one or more circuits 240 to be configured. The nonvolatile memory 100 or 200 as shown above is also suitable for a lower voltage flash memory including the 1.8 volts flash memory.

Figure 3:
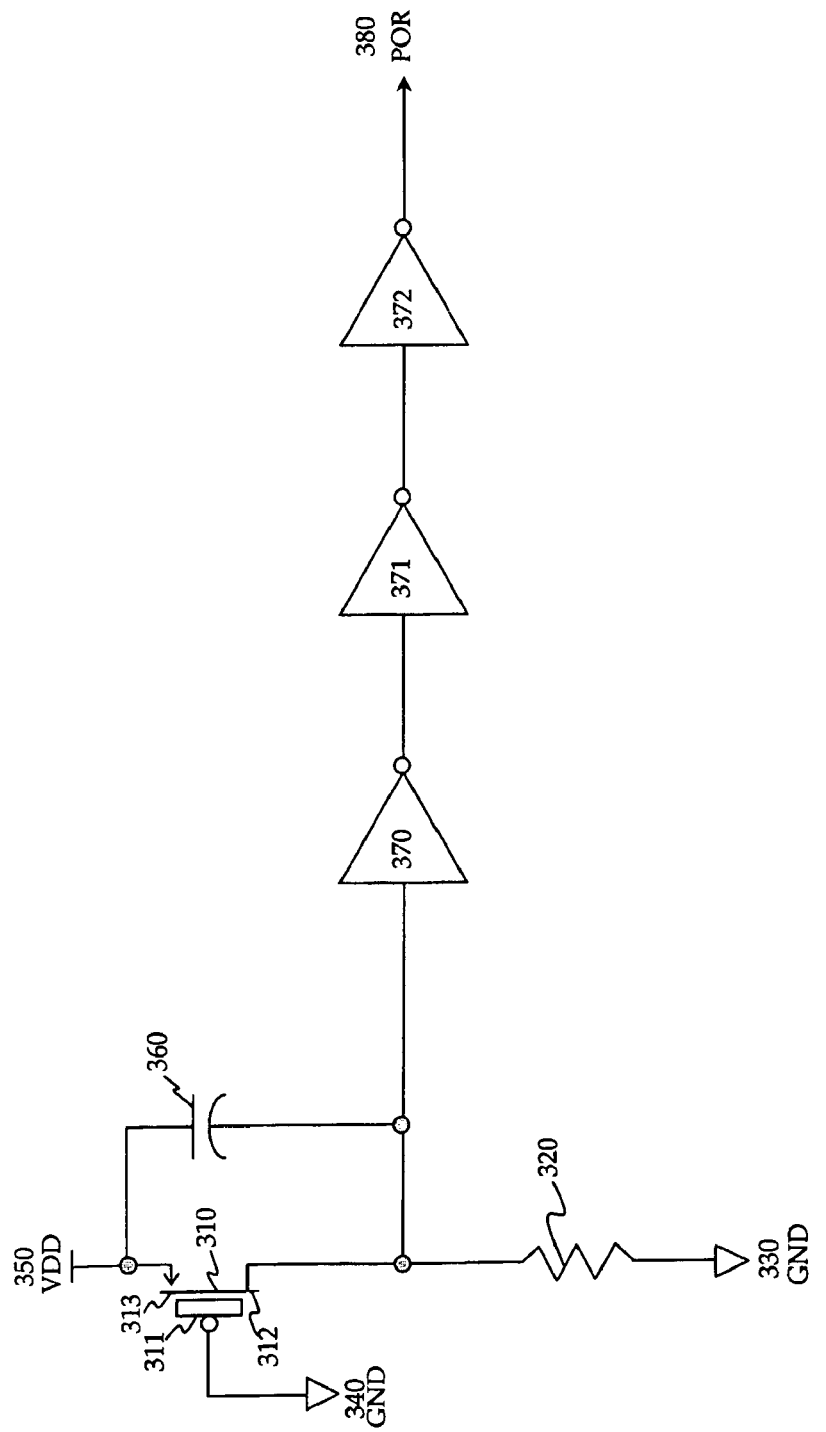
FIG. 3 is a schematic diagram illustrating a power-on reset circuit for resetting registers in the first and second embodiments of the nonvolatile memories in accordance with the present invention.

FIG. 3 is a schematic diagram illustrating a power-on reset circuit 300 for resetting registers in the nonvolatile memory 100 or the nonvolatile memory 200. The power-on reset circuit 300 includes an enhancement-type PMOS transistor 310 having a gate terminal 311, a drain terminal 312, and a source terminal 313. The drain terminal 312 of the PMOS transistor 310 is connected to a series resister 320, which in turn is connected to a ground 330. The gate terminal 311 of the PMOS transistor 310 is connected to a ground 340. The source terminal 313 of the PMOS transistor 310 is connected a Vdd 350. A resistor value is selected based on the specification of the power-on reset circuit 300. A capacitor 360 is coupled between the Vdd voltage 350 from a power supply to the drain terminal 312 of the PMOS transistor 310. Three cascaded inverters 370, 371 and 372 are coupled in series for receiving a signal from the drain terminal 312 of the PMOS transistor 310. The triggering point of the first inverter 370 is set based on a voltage that the power-on reset circuit 300 is designed to detect. The second inverter 371 and the third inverter 372 serve as the buffer for the driver of an output POR signal 380. The output POR signal 380 resets all registers on an integrated circuit. When the power reaches a predetermined level, the output POR signal 380 disables in order to enable a set of operations of the integrated circuit, such as load data from fuse cells to the registers. The power-on reset circuit 300 advantageously provides a simple and stable circuit. One suitable application of the power-on reset circuit 300 is to operate with a power supply of 1.6 volts.

Figure 4:
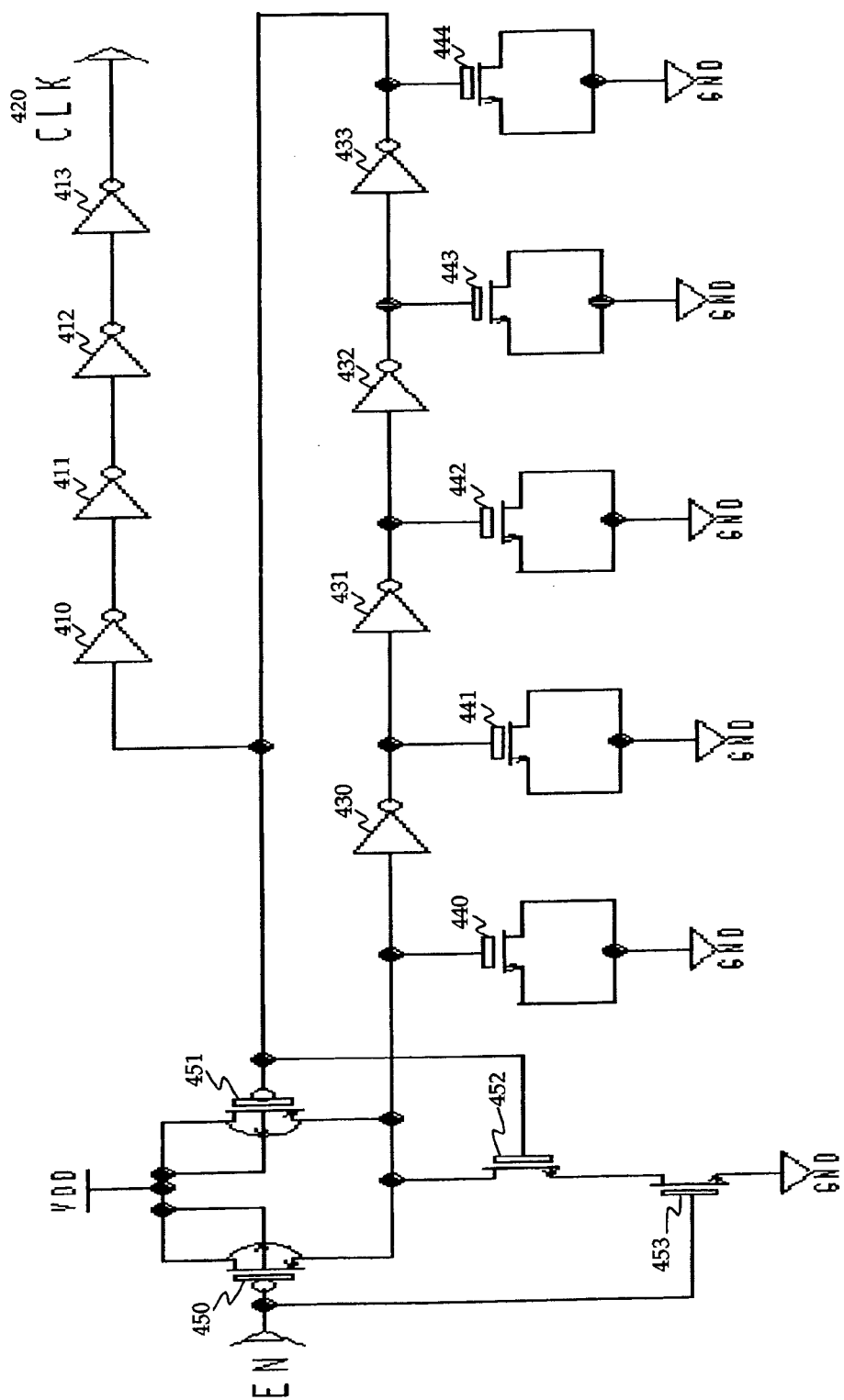
FIG. 4 is a schematic diagram illustrating a clock circuit for a power-on reset read in accordance with the present invention.

As shown in FIG. 4, there is a schematic diagram illustrating a clock circuit 400 for a power-up reset read. A first set of inverters 410, 411, 412 and 413 operates as ring oscillators for generating a CLK signal 420. A second set of inverters 430, 431, 432 and 433, positioned prior to and coupled to the first set of inverters 410, 411, 412 and 413, operates as a buffer to the CLK signal 420. A plurality of NMOS transistors 440, 441, 442, 443 and 444 combine to function as capacitance, where the value of the capacitance is determined by the size of the inverters and the frequency of an oscillator. Additional PMOS transistors 450, 451 and NMOS transistors 452, 453 serve as an enable control circuit for the CLK signal 420. When the POR signal 380 is asserted low in FIG. 3, the oscillator is enabled automatically. The clock circuit 400 is designed to operate even if the power supply is at a lower voltage, e.g. only 1 volt. When the clock circuit 400 for power-up read starts to operate, the CLK signal 420 is activated. After the clock circuit 400 for power-up read is completed, the CLK signal 420 is disabled.

Figure 5:
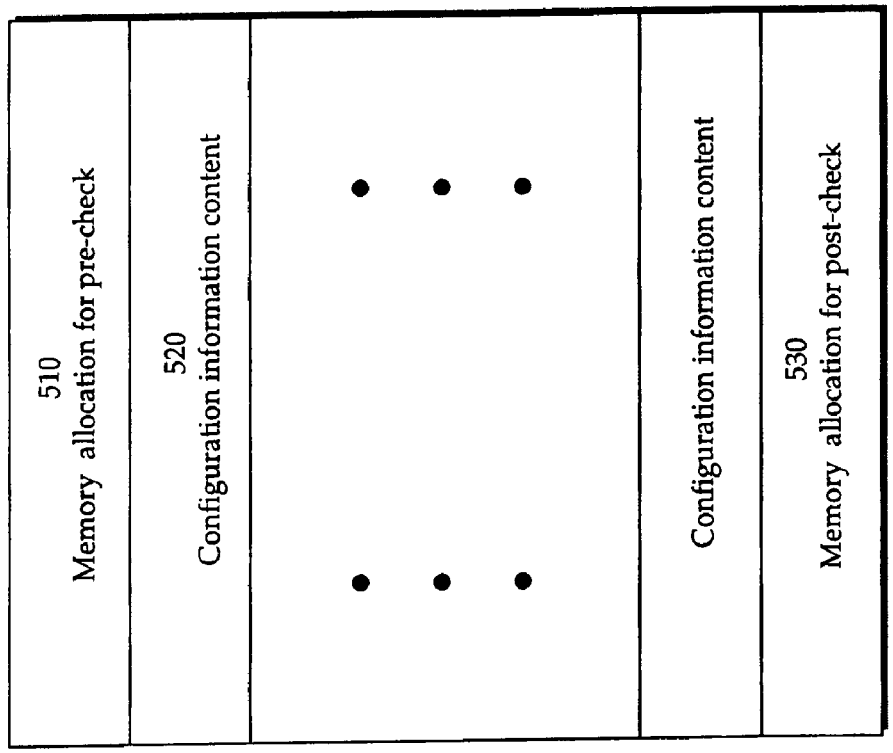
FIG. 5 is a block diagram illustrating a fuse memory array showing the fuse cells organization structure in accordance with the present invention.

In FIG. 5, there is shown a block diagram illustrating a fuse memory 500 showing a fuse cells organization structure, which is implemented in the fuse memory 170 in the first embodiment or the fuse memory 210 in the second embodiment. The fuse cells in the fuse memory 500 are organized in three sections, a pre-check memory 510, a configuration information content 520 and a post-check memory 530. The pre-check memory 510 and the post-check memory 530 are placed in the worst read path in the fuse memory 500 for the purpose of providing the worse case scenario in reading fuse cells, which are typically located at the top and at the bottom addresses of the fuse memory 500. When a read is successfully performed in the pre-check memory 510 and a read is successfully performed in the post-check memory 530, that would provide the worst-case scenario of a read operation. Therefore, if the pre-check memory 510 is read correctly and the post-check memory 530 is read correctly, the fuse cells in other locations of the fuse memory 500 should also be read correctly.

Figure 6:
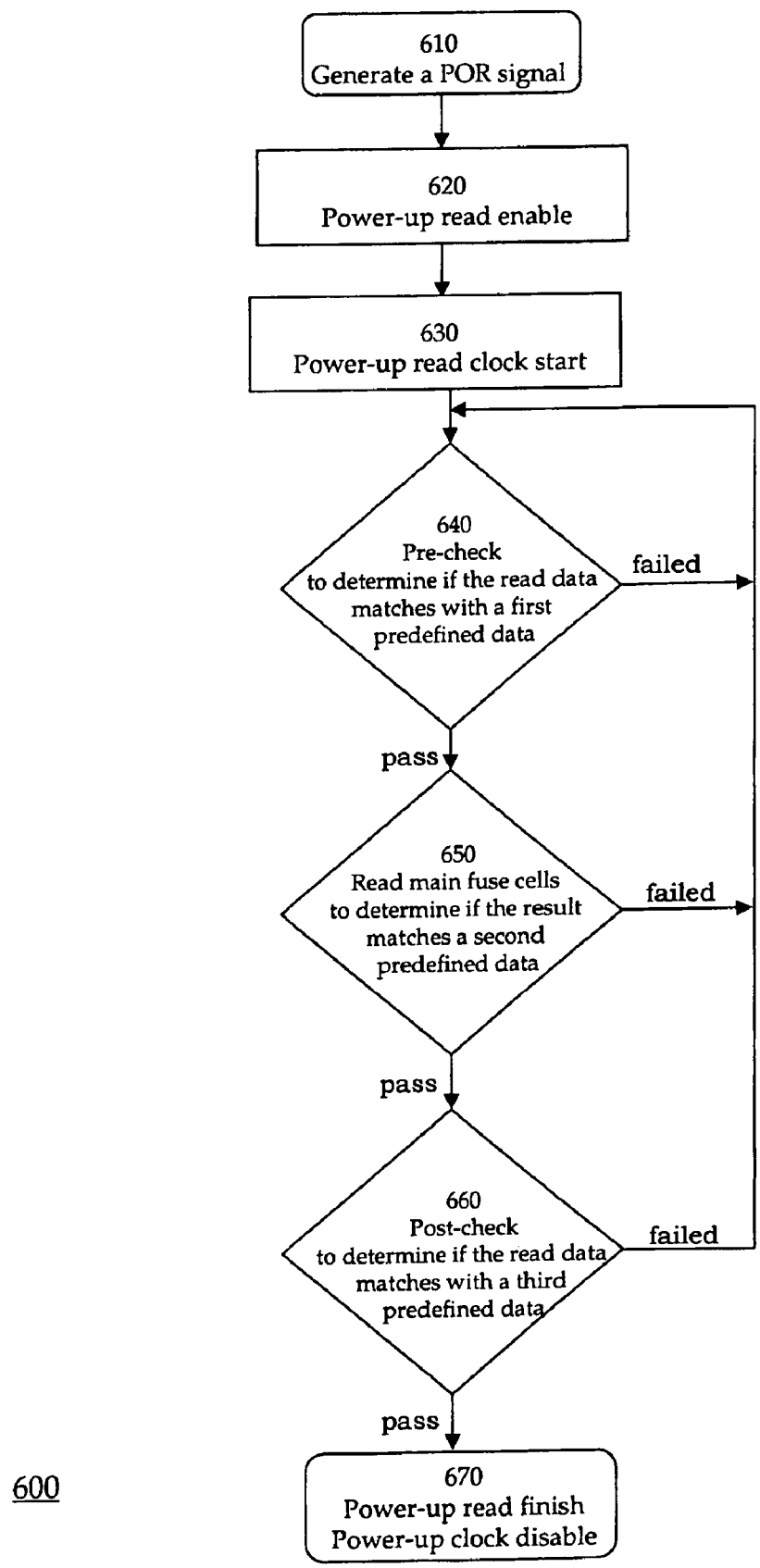
FIG. 6 is a flow diagram illustrating the process of a read flow from fuse cells in a fuse array during power-up in accordance with the present invention.

Turning now to FIG. 6, there is shown a flow diagram illustrating the process 600 of a read flow employing fuse cells in the fuse memory 500 during power-up. In one embodiment, prior to performing the power-up read at step 610, a first predefined data is loaded into the first memory allocation 510 for pre-check, a second predefined data is loaded into the configuration information content 520, and a third predefined data is loaded into the memory allocation 530 for post-check. At step 610, the power-on-reset circuit 300 generates the POR signal 380 for resetting the registers of the nonvolatile memory 100 or 200. After power-on-reset operation has been completed, at step 620, the process 600 enables power-up read operation. When power-up read is enabled, at step 630, the process enables a clock for power-up read. At step 640, the process 600 conducts a pre-check procedure to determine whether the read data matches with a first predefined data. If the result is no match, the process 600 returns to the pre-check procedure at step 640. If there is a match between the read data and the first predefined data, the process 600 proceeds to the next step. At step 650, the process 600 loads the content in a fuse cell to a register and reads the main fuse cells to determine if the result matches a second predefined data. If the result is not match, the process 600 returns to the pre-check procedure at step 640. If there is a match between the read data from main fuse cells and the second predefined data, the process 600 continues to the next step. At step 660, the process 600 conducts a post-check to determine if the read data matches with a third predefined data. If the result is no match, the process 600 returns to the pre-check procedure at step 640. Otherwise, if the read address generated is from the last line of the fuse memory 500, at step 670, the process 600 completes power-up read, disables power-up read action, and disables the clock for power-up read to conserve power.

Figure 7:
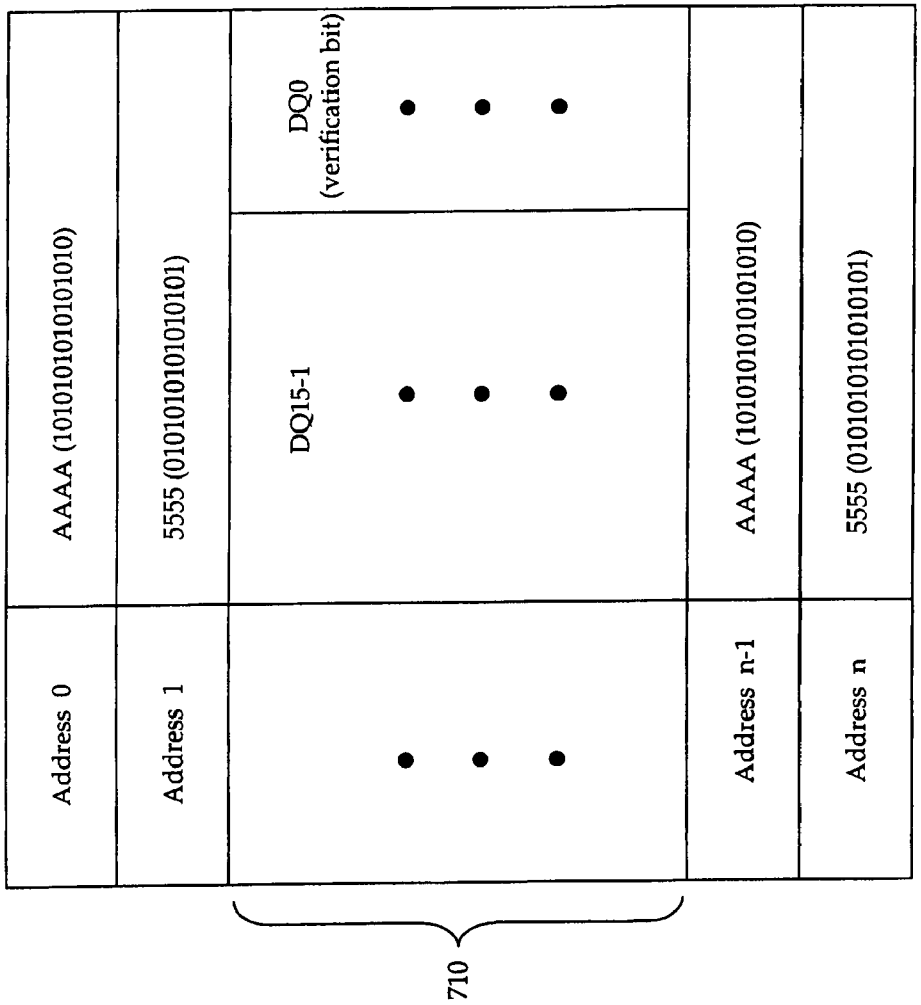
FIG. 7 is a block diagram illustrating a first embodiment of a fuse cells memory structure in accordance with the present invention.

FIG. 7 is a block diagram illustrating a first embodiment of a fuse cells memory structure 700. The fuse cells memory structure 700 is written with a plurality of data including the predefined data to be checked and configurable information during the testing of the nonvolatile memory 100 or 200. Two adjacent words are used for either the pre-check procedure or the post-check procedure. The first data portion of the predefined data is AAAA16 and the second data portion of the predefined data is 555516, which are the two words that are predefined for use during the pre-check procedure. The selections of the hexadecimal representation of AAAA16 and the hexadecimal representation of 555516 possess the characteristics in that their binary representations have opposite binary values. The binary value of AAAA16 is a string of repeating "10" which produces "1010101010101010". The binary value of 555516 is a string of repeating "01" which produces "0101010101010101". The data patterns of AAAA16 and 555516 have been used as illustrative samples to check the memory in a system test in part because these two data patterns provides a wide range of fault coverage. One of skill in the art should recognize that other data patterns that ensure a proper power-up read can also be used without departing from the spirits of the present invention.

During the pre-check procedure, the first address line, address 0, in the fuse cells memory structure 700 is written with the data of AAAA16 (1010101010101010). The second address line, address 1, in the fuse cells memory structure 700 is written with the data of 555516(0101010101010101). When the first two data read out from the address 0 and the address 1 match with the first predefined data, the power supply is therefore ready to conduct a fuse cells read. For a correct reading, the first data read out from address 0 is equal to AAAA16 (10101010101010100), and the second data read out from address 1 is equal to 555516 (0101010101010101). However, if the first data read of AAAA16 is inconsistent, the likelihood is that the second data read will not result in 555516. Because the delay in the first data read and the second data read is only one period of clock cycle time, there is a high likelihood that there would be insufficient time to inverse every bit from the 1010101010101010 to 0101010101010101.

For the post-check procedure, the data pattern in the last two addresses in the fuse cells memory structure 700 is also AAAA16 and 555516. The address n−1 in the fuse cells memory structure 700 is written with the data of AAAA16 (1010101010101010). The address n in the fuse cells memory structure 700 is written with the data of 555516(0101010101010101). When the last two data read out from the address n−1 and the address n are match the third predefined data, the power supply is therefore ready to conduct a fuse cells read. For a correct reading, the n−1 data read out from address n−1 is equal to AAAA16 (1010101010101010), and the nth data read out from address n is equal to 555516 (0101010101010101). However, if the n−1 read result of AAAA16 is inconsistent, the likelihood is that the nth read will not result in the correct reading of 555516. Because the delay in the n−1 read and the nth read is only one period of clock cycle time, there would be insufficient time to inverse every bit from the 1010101010101010 to 0101010101010101.

The first address and the last address typically include the worst case scenario for reading "0" or "1". The correct reading of the first address and the last address ensures that data being read in other addresses are correct. In a configuration information content section 710, a DQ0 in each row of DQ 15-0 serves as a verification bit to indicate if the word data is an odd number or an even number. The process flow of a power-up read checks whether the read result is a match to what have been predefined. The check procedure is performed for each word read, which would be a suitable feature in a noisy power-up condition. Optionally, redundant data can be inserted by various locations in the configuration information content section.

Figure 8:
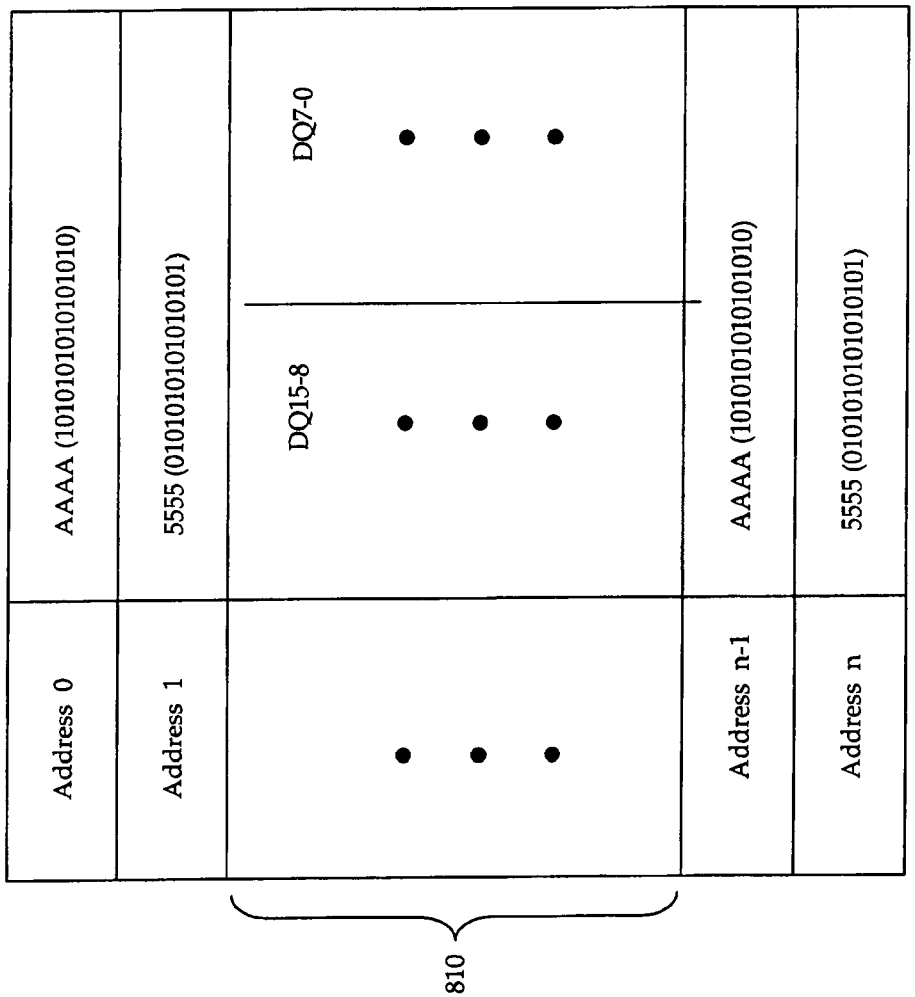
FIG. 8 is a block diagram illustrating a second embodiment of a fuse cells memory structure in accordance with the present invention.

FIG. 8 is a block diagram illustrating a second embodiment of a fuse cells memory structure 800. The high byte and the low byte for each word in the configuration information content section 810 are the same. The high byte DQ 15-8 is 7-bit wide and the low byte DQ7-0 is 7-bit wide. The fuse cells memory structure 800 in this embodiment provides more redundant data area. In a fuse memory, the dummy cells area and the periphery circuit generally occupy a larger area than the fuse cells.

The invention has been described with reference to specific exemplary embodiments. Various modifications, adaptations, and changes may be made without departing from the spirit and scope of the invention. For example, although the present invention shows two embodiments in the placement of the fuse memory as shown in FIGS. 1 and 2, the fuse memory can be placed in other alternative arrangements or in combination with other circuits. In addition, although the first, second, and third predefined data in one embodiment are selected prior to generating the POR signal, it is apparent to one of skill in the art that the predefined data can be defined using other methods or at other junctures in a process flow. Accordingly, the specification and drawings are to be regarded as illustrative of the principles of this invention rather than restrictive, the invention is defined by the following appended claims.

We claim:

1. A method for reading configuration stored in a fuse memory during a power-up operation in a nonvolatile memory, the fuse memory having a pre-check fuse cells memory section, a main fuse cells memory section, storing configuration information, and a post-check fuse cells memory section, comprising:
   performing a pre-check operation during the power-up operation by reading data from the pre-check fuse cells memory section to determine if the read data from the pre-check fuse cells memory section matches with a predefined pre-check data;
   reading the configuration information during the power-up operation from the main fuse cells memory section, and storing the configuration information for use in operating the non-volatile memory; and
   performing a post-check operation during the power-up operation by reading data from the post-check fuse cells memory section to determine if the read data from the post-check fuse cells memory section matches with a predefined post-check data; and
   if the pre-check and post-check operations result in determining matches, then completing the read of configuration information, else retrying the pre-check operation, the reading of the configuration information and the post-check operation.

2. The method of claim 1, prior to performing the pre-check, operation, further comprising loading the predefined pre-check data into a first address and a second address in the pre-check fuse cells memory section.

3. The method of claim 2, prior to performing the pre-check, operation, further comprising loading at least part of the configuration information into the main fuse cells memory section.

4. The method of claim 3, prior to performing the pre-check operation, further comprising loading the predefined post-check data into a next-to-last address and a last address in the post-check fuse cells memory section.

5. The method of claim 1, prior to performing the pre-check, operation, generating a power-on reset signal.

6. The method of claim 5, after the generating step, further comprising enabling a power-up operation.

7. The method of claim 6, after the enabling step, further comprising starting a clock for the power-up operation.

8. The method of claim 7, after performing the post-check, further comprising disabling the clock for the power-up operation.

9. The method of claim 2 wherein the predefined pre-check data comprises a first word of AAAA in hexadecimal for the first address in the pre-check fuse cells memory section and a second word of 5555 in hexadecimal for the second address in the pre-check fuse cells memory section.

10. The method of claim 1, wherein the nonvolatile memory comprises a low voltage flash memory.

11. A nonvolatile memory, comprising:
    a flash memory array;
    a fuse memory coupled to the memory array for verifying an operational voltage during a power-up operation, including:
       a pre-check fuse cells memory section for storing a predefined pre-check data;
       a main fuse cells memory section coupled to the first fuse cells memory section for storing configuration information; and
       a post-check fuse cells memory section coupled to the main fuse cells memory section for storing a predefined post-check data; and
    logic coupled to the first fuse memory responsive to a power-on reset to
       first read the predefined pre-check data from the pre-check fuse cells memory section in a pre-check operation during the power-up operation to determine if the read data matches with the predefined pre-check data,
       second read the configuration information from the main fuse cells and store the configuration information for use in operation of the flash memory array,
       third read the predefined post-check data from the post-check fuse cells memory section in a post check operation during the power-up operation to determine if the read data matches with the predefined post-check data, and
       if the pre-check and post-check operations result in determining matches, then completing the read of configuration information, else retrying the pre-check operation, the reading of the configuration information and the post-check operation.

12. The nonvolatile memory of claim 11 wherein the fuse memory is coupled to the memory array and the fuse memory is attached next to the memory array.

13. The nonvolatile memory of claim 11 where the fuse memory is coupled to the memory array but is not attached the memory array.

14. The nonvolatile memory of claim 11 further comprising a power-on reset circuit coupled to the fuse memory for resetting registers, the registers coupled to the power-on-reset circuit.

15. The nonvolatile memory of claim 14 further comprising a clock circuit, coupled to the fuse memory, for enabling the power-up operation.

* * * * *

UNITED STATES PATENT AND TRADEMARK OFFICE
CERTIFICATE OF CORRECTION

PATENT NO. : 7,433,247 B2  
APPLICATION NO. : 11/235826  
DATED : October 7, 2008  
INVENTOR(S) : Zheng et al.

Page 1 of 1

It is certified that error appears in the above-identified patent and that said Letters Patent is hereby corrected as shown below:

Column 7, line 29 after the word "configuration" insert the word -- information --.

Signed and Sealed this

Second Day of February, 2010

David J. Kappos  
*Director of the United States Patent and Trademark Office*